United States Patent
Kim et al.

(10) Patent No.: US 8,159,275 B2
(45) Date of Patent: Apr. 17, 2012

(54) PHASE-LOCKED LOOP AND BIAS GENERATOR

(75) Inventors: Young-Sik Kim, Gunpo-si (KR);
Seung-Jun Bae, Hwaseong-si (KR);
Sang-Hyup Kwak, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 199 days.

(21) Appl. No.: 12/627,730

(22) Filed: Nov. 30, 2009

(65) Prior Publication Data

US 2010/0141311 A1 Jun. 10, 2010

(30) Foreign Application Priority Data

Dec. 9, 2008 (KR) .................. 10-2008-0124843

(51) Int. Cl.
*H03L 7/06* (2006.01)
(52) U.S. Cl. ........................ 327/156; 327/147
(58) Field of Classification Search .................. 327/147, 327/156
See application file for complete search history.

(56) References Cited

U.S. PATENT DOCUMENTS

| 7,250,803 | B2 * | 7/2007 | Kazuma | 327/291 |
| 2007/0200603 | A1 * | 8/2007 | Shi et al. | 327/156 |
| 2008/0084233 | A1 * | 4/2008 | Lee | 327/156 |
| 2009/0079480 | A1 * | 3/2009 | Kimura et al. | 327/156 |
| 2009/0295440 | A1 * | 12/2009 | Gu | 327/157 |

FOREIGN PATENT DOCUMENTS

| JP | 2001-016098 | 1/2001 |
| JP | 2002-198811 | 7/2002 |
| KR | 1020050073933 | 7/2005 |
| KR | 1020060092559 | 8/2006 |

OTHER PUBLICATIONS

English Abstract for Publication No. 2001-016098.
English Abstract for Publication No. 2002-198811.
English Abstract for Publication No. 1020050073933.
English Abstract for Publication No. 1020060092559.

* cited by examiner

*Primary Examiner* — Lincoln Donovan
*Assistant Examiner* — Adam Houston
(74) *Attorney, Agent, or Firm* — F. Chau & Associates, LLC

(57) ABSTRACT

A phase-locked loop (PLL) having a bias generator capable of reducing noise is provided. In the PLL, a voltage controlled oscillator is driven using a regulator. The bias generator, which applies a bias voltage to the regulator, is configured to have opposite power noise characteristics to the power noise characteristics of the regulator, such that the occurrence of jitter in the PLL is reduced.

10 Claims, 3 Drawing Sheets

PHASE-LOCKED LOOP AND BIAS GENERATOR

CROSS-REFERENCE TO RELATED APPLICATION

This application claims priority to and the benefit of Korean Patent Application No. 10-2008-0124843, filed Dec. 9, 2008, the entire contents of which are incorporated by reference herein.

BACKGROUND

1. Technical Field

Exemplary embodiments relate to a phase-locked loop (PLL), and more particularly, to a PLL having a bias generator.

2. Discussion of Related Art

A PLL is a circuit that detects a phase difference between an input clock signal and an output clock signal output by a voltage controlled oscillator (VCO) and determines the frequency and phase of the output clock signal. The PLL is widely used to synchronize the frequency of the input clock signal with that of the output clock signal.

SUMMARY

Exemplary embodiments of the inventive concept provide a PLL having a bias generator capable of reducing noise. Exemplary embodiments of the inventive concept also provide the bias generator for the PLL. In the PLL, a voltage controlled oscillator is driven using a regulator. The bias generator, which applies a bias voltage to the regulator, is configured to have opposite power noise characteristics to the power noise characteristics of the regulator, such that the occurrence of jitter in the PLL is reduced.

According to an exemplary embodiment, a PLL includes a phase detector configured to compare the phase of an input clock signal with the phase of an output clock signal and output an up signal and a down signal. A charge pump is configured to charge and discharge electric charges in response to the up signal and the down signal, respectively, and output a pumping voltage. A loop filter is configured to filter the pumping voltage and output a filtering voltage; a bias generator configured to generate a bias voltage inversely proportional to a power supply voltage. A regulator is configured to receive the bias voltage and the filtering voltage and output a control voltage having the same voltage level as the filtering voltage. A voltage controlled oscillator (VCO) is configured to control and output the frequency of the output clock signal in response to the control voltage.

The bias generator may include: a bias generation unit connected between the power supply voltage and a ground voltage and configured to generate first and second bias set voltages, which are proportional to the power supply voltage, through first and second bias nodes, respectively, to generate the bias voltage through a bias output node; and a first bias control unit connected between the bias output node and the ground voltage and configured to control the bias voltage to be inversely proportional to the power supply voltage in response to the second bias set voltage.

The bias generator may include: a bias mirror unit connected between the power supply voltage and the first bias node and between the power supply voltage and the bias output node and configured to generate the bias voltage through the bias output node in response to the first bias set voltage; a bias set unit connected between the power supply voltage and the ground voltage and between the first bias node and the ground voltage and configured to control voltage levels of the first and second bias set voltages in response to a voltage level of the power supply voltage; and a bias output unit connected between the bias output node and the ground voltage and configured to receive the bias voltage and output the bias voltage through the bias output node.

The bias mirror unit may include: a first p-type metal oxide semiconductor (PMOS) transistor connected between the power supply voltage and the first bias node and having a gate connected to the first bias node; and a second PMOS transistor connected between the power supply voltage and the bias output node and having a gate connected to the first bias node.

The bias set unit may include: a first n-type metal oxide semiconductor (NMOS) transistor connected between the first bias node and the second bias node; a resistor connected between the second bias node and the ground voltage; and an inverter configured to invert the second bias set voltage and apply the inverted second bias set voltage to a gate of the first NMOS transistor.

The bias output unit may include a third NMOS transistor connected between the bias output node and the ground voltage and having a gate connected to the bias output node.

The first bias control unit may include a second NMOS transistor connected between the bias output node and the ground voltage and having a gate to which the second bias set voltage is applied.

The bias generator may further include a second bias control unit connected between the power supply voltage and the bias output node and between the power supply voltage and the ground voltage and configured to control the bias voltage to be inversely proportional to the power supply voltage as a linear function in response to a voltage level of the power supply voltage. The second bias control unit may include: a third PMOS transistor connected between the power supply voltage and the bias output node and having a gate connected to a third bias node; a fourth PMOS transistor connected between the power supply voltage and the third bias node and having a gate connected to the third bias node; and a fourth NMOS transistor connected between the third bias node and the ground voltage and having a gate connected to the third bias node.

The regulator may include: a differential input unit connected between a first node and a third node and between a second node and the third node and configured to detect a voltage difference between the filtering voltage and the control voltage and generate the voltage difference through the first and second nodes; a first current mirror unit connected between the power supply voltage and the first node and between the power supply voltage and an output node through which the control voltage is output, and configured to mirror current supplied to the first node and control current supplied to the output node; a second current mirror unit connected between the power supply voltage and the second node and between the power supply voltage and a fourth node and configured to mirror current supplied to the second node and control current supplied to the fourth node; a third current mirror unit connected between the fourth node and the ground voltage and between the output node and the ground voltage and configured to mirror the current supplied to the fourth node and control current supplied to the output node; and a bias unit connected between the third node and the ground voltage and configured to receive the bias voltage and supply a bias current to the third node.

According to an exemplary embodiment, a bias generator includes a bias mirror unit connected between a power supply voltage and a first bias node and between the power supply voltage and a bias output node and is configured to supply current corresponding to current supplied to the first bias node to the bias output node. A bias set unit is connected between the power supply voltage and a ground voltage and between the first bias node and the ground voltage and configured to control voltage levels of the first bias node and a second bias node connected between the first bias node and the ground node in response to a voltage level of the power supply voltage. A first bias control unit is connected between the bias output node and the ground voltage and configured to control a bias voltage to be inversely proportional to the power supply voltage in response to a voltage of the second bias node. A bias output unit is connected in parallel to the first bias control unit and is configured to receive the bias voltage and output a bias output voltage through the bias output node. A second bias control unit is connected between the power supply voltage and the bias output node and between the power supply voltage and the ground voltage and is configured to control the bias voltage to be inversely proportional to the power supply voltage as a linear function in response to the voltage level of the power supply voltage.

According to an exemplary embodiment an apparatus for applying a control voltage to a voltage controlled oscillator includes a bias generator configured to generate a bias voltage inversely proportional to a power supply voltage, and a regulator configured to receive the bias voltage and an input voltage and output the control voltage having the same voltage level as the input voltage. The bias generator includes: a bias mirror unit connected between a power supply voltage and a first bias node and between the power supply voltage and a bias output node and configured to supply current corresponding to current supplied to the first bias node to the bias output node; a bias set unit connected between the power supply voltage and a ground voltage and between the first bias node and the ground voltage and configured to control voltage levels of the first bias node and a second bias node connected between the first bias node and the ground node in response to a voltage level of the power supply voltage; a first bias control unit connected between the bias output node and the ground voltage and configured to control a bias voltage to be inversely proportional to the power supply voltage in response to a voltage of the second bias node; a bias output unit connected in parallel to the first bias control unit and configured to receive the bias voltage and output a bias output voltage through the bias output node; and a second bias control unit connected between the power supply voltage and the bias output node and between the power supply voltage and the ground voltage and configured to control the bias voltage to be inversely proportional to the power supply voltage as a linear function in response to the voltage level of the power supply voltage. The regulator includes: a differential input unit connected between a first regulator node and a third regulator node and between a second regulator node and the third regulator node and configured to detect a voltage difference between the input voltage and the control voltage and to generate the voltage difference through the first regulator node and the second regulator node; a first current mirror unit connected between the power supply voltage and the first regulator node and between the power supply voltage and an output node through which the control voltage is output, and configured to mirror current supplied to the first regulator node and control current supplied to the output node; a second current mirror unit connected between the power supply voltage and the second regulator node and between the power supply voltage and a fourth regulator node and configured to mirror current supplied to the second regulator node and control current supplied to the fourth regulator node; a third current mirror unit connected between the fourth regulator node and the ground voltage and between the output node and the ground voltage and configured to mirror the current supplied to the fourth regulator node and control current supplied to the output node; and a regulator bias unit connected between the third regulator node and the ground voltage and configured to receive the bias output voltage and supply a bias current to the third regulator node.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF THE EXEMPLARY EMBODIMENTS

Various exemplary embodiments will now be described more fully with reference to the accompanying drawings.

Figure 1:
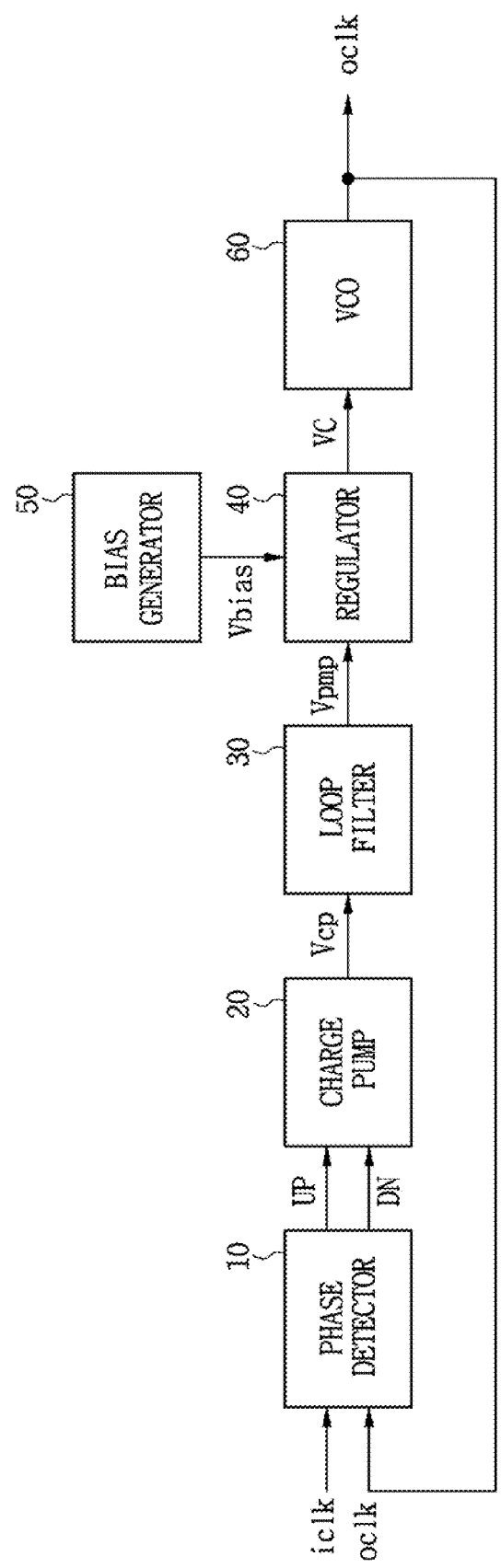
FIG. 1 is a block diagram of a PLL according to an exemplary embodiment of the inventive concept.

Referring to FIG. 1, a PLL includes a phase detector 10, a charge pump 20, a loop filter 30, a regulator 40, a bias generator 50, and a VCO 60.

The phase detector 10 receives an externally applied input clock signal "iclk" and an output clock signal "oclk" output by the VCO 60, compares the phases of the two clock signals "iclk" and "oclk", and outputs an up signal UP or a down signal DN. The charge pump 20 charges and discharges electrical charges in response to the up signal UP and the down signal DN, respectively, and outputs a pumping voltage Vcp. The loop filter 30 functioning as a low pass filter (LPF) filters the pumping voltage Vcp and outputs a filtering voltage Vpmp. The regulator 40 receives the filtering voltage Vpmp and stably supplies a control voltage VC having the same voltage level as the filtering voltage Vpmp. The bias generator 50 generates a bias voltage Vbias and a bias current Ibias to stably operate the regulator 40 and supplies the bias voltage Vbias and the bias current Ibias to the regulator 40. The VCO 60 controls the frequency of the output clock signal "oclk" in response to the control voltage VC and outputs the controlled output clock signal "oclk". Although not shown, the PLL may further include a divider to generate the output clock signal "oclk" having a higher frequency than that of the input clock signal "iclk". Thus, the divider may receive the output clock signal "oclk" from the VCO 60, divide the frequency of the output clock signal "oclk", and output the divided output clock signal "oclk" to the phase detector 10.

Figure 2:
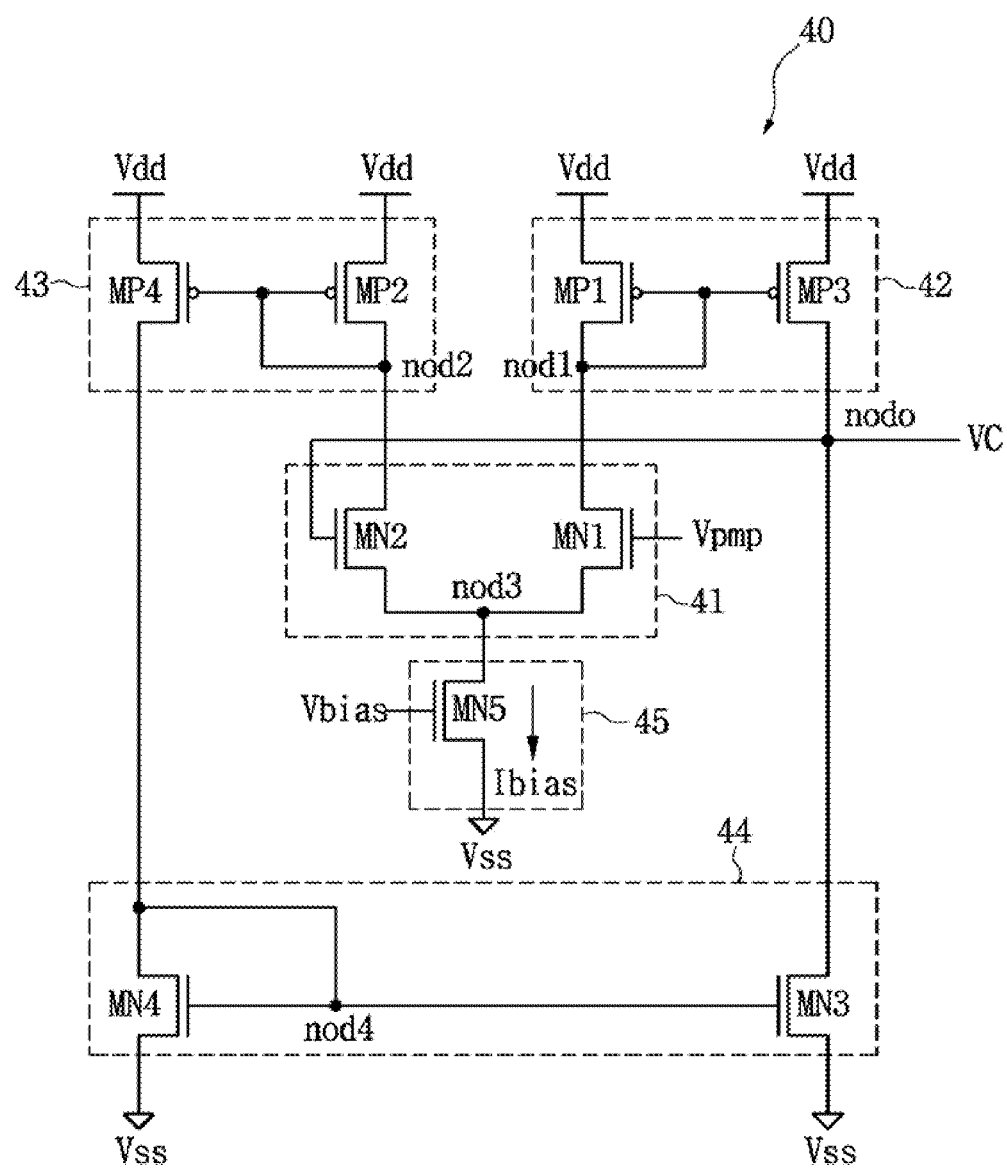
FIG. 2 is a diagram of an exemplary embodiment of the regulator of FIG. 1.

FIG. 2 is a diagram of an exemplary embodiment of the regulator 40 of FIG. 1, which illustrates a current-mirror-type differential amplifier. The regulator 40 of FIG. 2 includes a differential input unit 41, a current mirror unit 42, a second current mirror unit 43, a third current mirror unit 44, and a bias unit 45.

The differential input unit 41 includes n-type metal oxide semiconductor (NMOS) transistors MN1, MN2. The NMOS transistor MN1 is connected between a first node nod1 and a third node nod3 and has a gate to which a filtering voltage Vpmp is applied. The NMOS transistor MN2 is connected between a second node nod2 and the third node nod3 and has its gate connected to an output node "nodo" so that a control voltage VC can be applied to the gate of the NMOS transistor MN2. Thus, the differential input unit 41 detects a voltage difference between the filtering voltage Vpmp and the control voltage VC and generates the voltage difference through the first nod1 and the second node nod2.

The first current mirror unit 42 includes p-type metal oxide semiconductor (PMOS) transistors MP1, MP3. The PMOS transistor MP1 is connected between a power supply voltage Vdd and the first node nod1 and has its gate connected to the first node nod1. The PMOS transistor MP3 is connected between the power supply voltage Vdd and the output node "nodo" and has its gate connected to the first node nod1. Thus, the first current mirror unit 42 mirrors current supplied to the first node nod1 and controls current supplied to the output node "nodo". Here, the PMOS transistor MP3 has a high current drivability so as to supply sufficient current to the output node "nodo".

The second current mirror unit 43 includes PMOS transistors MP2, MP4. The PMOS transistor MP2 is connected between the power supply voltage Vdd and the second node nod2 and has its gate connected to the second node nod2. The PMOS transistor MP4 is connected between the power supply voltage Vdd and a fourth node nod4 and has its gate connected to the second node nod2. Thus, the second current mirror unit 43 mirrors current supplied to the second node nod2 and controls current supplied to the fourth node nod4.

The third current mirror unit 44 includes NMOS transistors MN3, MN4. The NMOS transistor MN3 is connected between the output node "nodo" and a ground voltage Vss and has its gate connected to the fourth node nod4. The NMOS transistor MN4 is connected between the fourth node nod4 and the ground voltage Vss and has its gate connected to the fourth node nod4. The third current mirror unit 44 mirrors current supplied to the fourth node nod2 and controls current supplied to the output node "nodo".

The bias unit 45 includes an NMOS transistor MN5 connected between the third node nod3 and the ground voltage Vss. The NMOS transistor MN5 has its gate to which the bias voltage Vbias is received and allows the transistors of the regulator 40 to operate in a saturation region. To enable the stable operation of the regulator 40, a constant amount of bias current Ibias needs to flow through the NMOS transistor MN5 irrespective of the filtering voltage Vpmp and the control voltage VC.

The operation of the regulator 40 will now be described with reference to FIG. 2. Initially, when the control voltage VC applied to the differential input unit 41 has a lower voltage level than the filtering voltage Vpmp, the amount of current flowing through the NMOS transistor MN1 becomes larger than that of current flowing through the NMOS transistor MN2. Thus, the voltage level of the first node nod1 becomes lower than that of the second node nod2. As a result, the PMOS transistors MP1, MP3 of the first current mirror unit 42 is enabled, and the enabled PMOS transistor MP3 increases the amount of current supplied to the output node "nodo".

The PMOS transistors MP2, MP4 of the second current mirror unit 43 are disabled due to the second node nod2 having a higher voltage level than the first node nod1, and the amount of current flowing through the fourth node nod4 decreases, thus dropping the voltage level of the fourth node nod4. Also, the third current mirror unit 44 configured to mirror the current flowing through the fourth node nod4 is disabled with the drop in the voltage level of the fourth node nod4. This leads to a reduction in the amount of current flowing from the output node "nodo" through the NMOS transistor MN3.

The amount of current supplied through the PMOS transistor MP3 to the output node "nodo" is increased, while the amount of current supplied from the output node "nodo" through the NMOS transistor MN3 to the ground voltage Vss is decreased. As a result, the control voltage VC output from the output node "nodo" rises to a higher voltage level. That is, the control voltage VC rises to the same level as the filtering voltage Vpmp.

However, when the control voltage VC is at a higher level than the filtering voltage Vpmp, the amount of current supplied through the NMOS transistor MN1 to the differential input unit 41 is smaller than that of current flowing through the NMOS transistor MN2. Thus, the voltage level of the first node nod1 becomes higher than that of the second node nod2. As a result, the PMOS transistors MP1, MP3 of the first current mirror unit 42 are disabled, and the disabled PMOS transistor MP3 reduces the amount of current supplied to the output node "nodo".

The PMOS transistors MP2, MP4 of the second current mirror unit 43 are enabled due to the second node nod2 having a lower voltage level than the first node nod1, and the amount of current flowing through the fourth node nod4 increases, thus boosting the voltage level of the fourth node nod4. Also, the third current mirror unit 44 configured to mirror the current flowing through the fourth node nod4 is enabled with the boost in the voltage level of the fourth node nod4. This leads to a rise in the amount of current flowing from the output node "nodo" through the NMOS transistor MN3.

The amount of current supplied through the PMOS transistor MP3 to the output node "nodo" is reduced, while the amount of current supplied from the output node "nodo" through the NMOS transistor MN3 to the ground voltage Vss is increased. As a result, the control voltage VC output from the output node "nodo" drops to a lower level. That is, the control voltage VC drops to the same level as the filtering voltage Vpmp.

When the control voltage VC is at the same level as the filtering voltage Vpmp, no voltage difference is generated through the first and second nodes nod1, nod2. Thus, the amount of current flowing through the first node nod1 of the differential input unit 41 is equal to the amount of current flowing through the second node nod2 thereof, and the voltage level of the control voltage VC output from the output node "nodo" is not varied.

When power noise occurs to raise the voltage level of the power supply voltage Vdd in the regulator 40 of FIG. 2, drain-source voltages Vds of the PMOS transistors MP3, MP4 are increased so that larger currents are supplied to the fourth node nod4 and the output node "nodo". This leads to an increase in the amount of current supplied to each of the NMOS transistors MN3, MN4. However, since the PMOS transistor MP3 has a higher current drivability than the NMOS transistor MN3 as described above, the increased amount of current supplied through the PMOS transistor MP3 to the output node "nodo" is larger than the increased amount of current supplied from the output node "nodo" through the NMOS transistor MN3 to the ground voltage Vss. Thus, the control voltage VC rises to a higher level, and the VCO 60 increases the frequency of the output clock signal "oclk" in response to the control voltage VC, thereby causing jitter. On the other hand, when power noise occurs to drop the voltage level of the power supply voltage Vdd, the reduced amount of current supplied through the PMOS transistor MP3 to the output node "nodo" is larger than the reduced amount of current supplied from the output node "nodo" through the NMOS transistor MN3 to the ground voltage Vss. Thus, the control voltage VC drops to a lower level, and the VCO 60 reduces the frequency of the output clock signal "oclk" in response to the control voltage VC, thereby causing jitter.

However, in the case where power noise occurs to raise the voltage level of the power supply voltage Vdd, when the bias voltage Vbias drops to a lower level, that is, when the bias current Ibias is reduced, current supplied through the PMOS transistor MP3 to the output node "nodo" is reduced with the rise in the voltage level of the first node nod1. Also, in the case where power noise occurs to drop the voltage level of the power supply voltage Vdd, when the bias voltage Vbias rises to a higher level, that is, when the bias current Ibias is increased, current supplied through the PMOS transistor MP3 to the output node "nodo" is increased with the drop in the voltage level of the first node nod1. Accordingly, even if noise occurs in the power supply voltage Vdd, the control voltage VC is maintained at a constant level, thereby preventing jitter.

Figure 3:
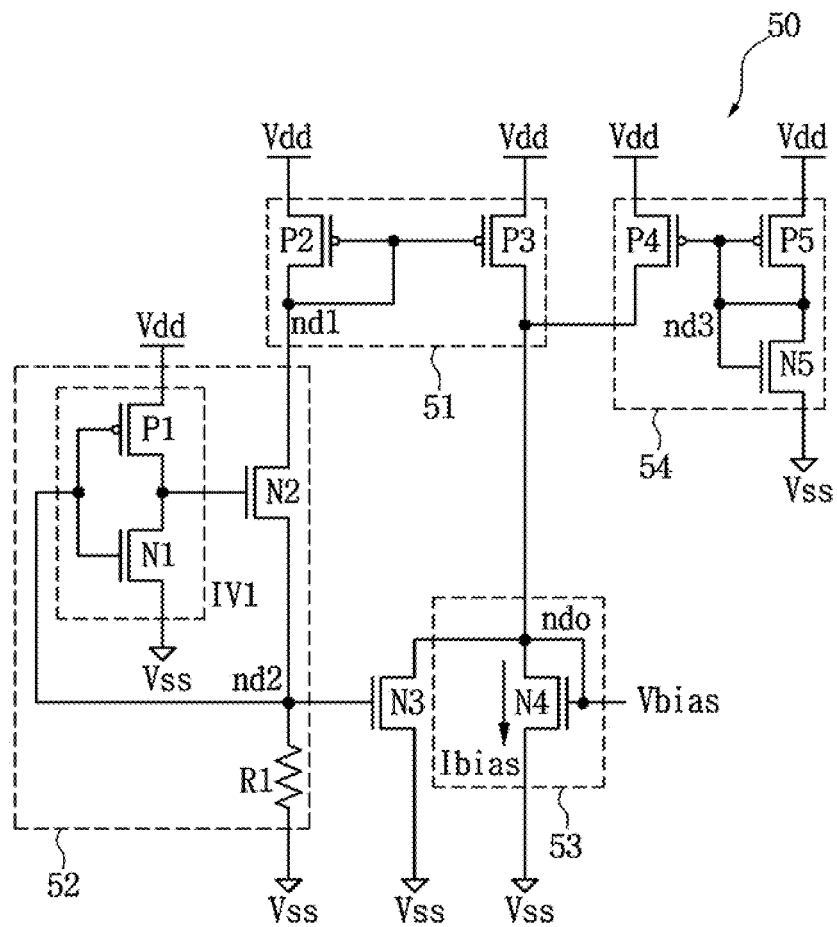
FIG. 3 is a diagram of a bias generator in accordance with an exemplary embodiment of the inventive concept.

FIG. 3 is a diagram of a bias generator 50 according to an exemplary embodiment. The bias generator 50 includes a bias mirror unit 51, a bias set unit 52, a bias output unit 53, a first bias control unit N3, and a second bias control unit 54. The bias mirror unit 51 includes PMOS transistors P2, P3. The PMOS transistor P2 is connected between a power supply voltage Vdd and a first bias node nd1 and has its gate connected to the first bias node nd1. The PMOS transistor P3 is connected between the power supply voltage Vdd and a bias output node "ndo" and has its gate connected to the first bias node nd1. Thus, the bias mirror unit 51 mirrors current supplied to the first bias node nd1 and controls current supplied to the output node "ndo".

The bias set unit 52 includes an NMOS transistor N2, a resistor R1, and an inverter IV1. The NMOS transistor N2 is connected between the first bias node nd1 and a second node nod2, and the resistor R1 is connected between the second bias node nd2 and a ground voltage Vss. The inverter IV1 inverts the voltage level of the voltage of the second bias node nd2 and applies an inverted voltage to the gate of the NMOS transistor N2. The inverter IV1 includes a PMOS transistor P1 and an NMOS transistor N1, which are connected between the power supply voltage Vdd and the ground voltage Vss and have their gates connected to the second bias node nd2. The bias set unit 52 controls the voltage level of the second bias node nd2 using the resistor R1, the inverter IV1, and the NMOS transistor N2 and determines the voltage level of the bias voltage Vbias. In this case, the voltage of the second bias node nd2 becomes a logic threshold value of the inverter IV1.

The bias output unit 53 includes an NMOS transistor N4 connected between the output node "ndo" and the ground voltage Vss. Both the gate and the drain of the NMOS transistor N4 are connected to the bias output node "ndo" so that the NMOS transistor N4 can receive the bias voltage Vbias from the bias output node "ndo" through its gate and simultaneously, output the bias voltage Vbias through its drain.

The first bias control unit N3 includes an NMOS transistor N3 connected in parallel to the NMOS transistor N4 between the bias output node "ndo" and the ground voltage Vss. The NMOS transistor N3 has its gate connected to the second bias node nd2. The NMOS transistor N3 allows the bias voltage Vbias to drop when power noise occurs to raise the voltage level of the power supply voltage Vdd, and to rise when power noise occurs to drop the voltage level of the power supply voltage Vdd. As a result, the first bias control unit N3 permits the bias voltage Vbias to exhibit opposite power noise characteristics to those of the regulator 40.

The second bias control unit 54 includes PMOS transistors P4, P5 and an NMOS transistor N5. The PMOS transistor P4 is connected between the power supply voltage Vdd and the bias output node "ndo", and the PMOS transistor P5 is connected between the power supply voltage Vdd and a third node nd3. The NMOS transistor N5 is connected between the third node nd3 and the ground voltage Vss. The PMOS transistors P4, P5 and the NMOS transistor N5 have their gates connected to the third node nd3. The PMOS transistor P5 and the NMOS transistor N5 are connected in series between the power supply voltage Vdd and the ground voltage Vss and have their gates and drains connected to the third node nd3. The PMOS transistor P5 and the NMOS transistor N5 allow the voltage of the third node nd3 to have the logic threshold value of an inverter embodied by the PMOS transistor P5 and the NMOS transistor N5. Thus, the PMOS transistor P5 and the NMOS transistor N5 control the characteristics of the bias voltage Vbias such that the power noise characteristics of the bias voltage Vbias due to the NMOS transistor N3 of the bias output unit 53 are symmetrically inversely proportional to the power noise characteristics of the regulator 40.

The characteristics of the bias voltage Vbias will now be described with reference to FIG. 3. The bias current Ibias flowing through the NMOS transistor N4 is obtained by subtracting current flowing through the NMOS transistor N3 from the sum of current flowing through the PMOS transistor P3 and current flowing through the PMOS transistor P4 as shown in Equation 1:

$$I\text{bias} = I(P3) - I(N3) + I(P4) \qquad \text{Eq. (1)}.$$

In this case, the current I (P3) flowing through the PMOS transistor P3 is generated by mirroring the current flowing through the first bias node nd1 using the bias mirror unit 51. Thus, the current I (P3) is proportional to the current flowing from the first and second nodes nd1, nd2 to the resistor R1. Also, assuming that the PMOS transistor P2 has the same current drivability as the PMOS transistor P3, the current flowing through the PMOS transistor P3 is equal to the current flowing through the resistor R1. Accordingly, the current I (P3) flowing through the PMOS transistor P3 is calculated using the current flowing through the resistor R1 as shown in Equation 2. Also, since the voltage level of the voltage of the second bias node nd2 has the logic threshold value of the inverter IV1 as described above, the current flowing through the resistor R1 can also be expressed using Equation 2:

$$I(P3) = \frac{V(nd2)}{R} \qquad \text{Eq. (2)}$$

$$V(nd2) = \frac{Vdd - Vtp1 + Vtn1s\sqrt{\frac{\beta n1}{\beta p1}}}{1 + \sqrt{\frac{\beta n1}{\beta p1}}}$$

$$= BsVdd - BsVtp1 + (1-B)sVtn1$$

wherein $$B = \frac{1}{1 + \sqrt{\frac{\beta n1}{\beta p1}}} < 1$$

$$\beta p1 = \mu_{p1} sCox_{p1} s \frac{W_{p1}}{L_{p1}}$$

-continued
$$\beta n1 = \mu_{n1}sCox_{n1}s\frac{W_{n1}}{L_{n1}}.$$

In Equation 2, Vtp1 and Vtn1 refer to the threshold voltages of the PMOS transistor P1 and the NMOS transistor N1, respectively, and βp1 and βn1 refer to the gain coefficients of the PMOS transistor P1 and the NMOS transistor N1, respectively. Also, $\mu_{p1}$ and $\mu_{n1}$ refer to the mobilities of the PMOS transistor P1 and the NMOS transistor N1, respectively, and $Cox_{p1}$ and $Cox_{n1}$ refer to the oxide capacitances of the PMOS transistor P1 and the NMOS transistor N1, respectively. Furthermore, $W_{p1}$ and $W_{n1}$ refer to the channel widths of the PMOS transistor P1 and the NMOS transistor N1, respectively, and $L_{p1}$ and $L_{n1}$ refer to the channel lengths of the PMOS transistor P1 and the NMOS transistor N1, respectively.

Since the NMOS transistor N3 receives the voltage V(nd2) of the second bias node nd2 through its gate, the current I(N3) flowing through the NMOS transistor N3 can be calculated as shown in Equation 3:

$$I(N3) = \frac{\beta n3}{2}S(V(nd2) - Vtn3)^2 \quad \text{Eq. (3)}$$

wherein $$\beta n3 = \mu_{n3}sCox_{n3}s\frac{W_{n3}}{L_{n3}}.$$

As in Equation 2, in Equation 3, Vtn3 refers to the threshold voltage of the NMOS transistor N3, βn1 refers to the gain coefficient of the NMOS transistor N3, $\mu_{n1}$ refers to the mobility of the NMOS transistor N3, and $Cox_{n1}$ refers to the oxide capacitance of the NMOS transistor N3. Also, $W_{n1}$ refers to the channel width of the NMOS transistor N2, and $L_{n1}$ refers to the channel length of the NMOS transistor N3.

Also, the PMOS transistor P4 has its gate connected to the third node nd3. Since the voltage of the third node nd3 has the logic threshold value of an inverter embodied by the PMOS transistor P5 and the NMOS transistor N5, the current I(P4) flowing through the PMOS transistor P4 can be expressed using Equation 4:

$$I(P4) = \frac{\beta p4}{2}s(Vdd - V(nd3) - |Vtp4|)^2 \quad \text{Eq. (4)}$$

$$V(nd3) = \frac{Vdd - Vtp5 + Vtn5\sqrt{\frac{\beta n5}{\beta p5}}}{1 + \sqrt{\frac{\beta n5}{\beta p5}}}$$

$$= KsVdd - KsVtp5 + (1-K)sVtn5$$

wherein $$K = \frac{1}{1 + \sqrt{\frac{\beta n5}{\beta p5}}} < 1$$

$$\beta p4 = \mu_{p4}sCox_{p4}s\frac{W_{p4}}{L_{p4}}$$

$$\beta p5 = \mu_{p5}sCox_{p5}s\frac{W_{p5}}{L_{p5}}$$

-continued
$$\beta n5 = \mu_{n5}sCox_{n5}s\frac{W_{n5}}{L_{n5}}.$$

By substituting Equations 2 through 4 into Equation 1, the bias current Ibias can be expressed as shown in Equation 5:

$$Ibias = \frac{V(nd2)}{R} - \frac{\beta n3}{2}s(V(nd2) - Vtn3)^2 + \quad \text{Eq. (5)}$$
$$\frac{\beta p4}{2}s(Vdd - V(nd3) - |Vtp4|)^2.$$

By substituting V(nd2) and V(nd3) of Equations 2 and 4 into Equation 5 and collecting a coefficient of $Vdd^2$, the coefficient of $Vdd^2$ can be expressed as shown in Numerical expression 6:

$$-\frac{\beta n3}{2}sB^2 + \frac{\beta p4}{2}s(1-K)^2. \quad \text{Num expr. (6)}$$

When Numerical expression 6 is 0, that is, when the coefficient of $Vdd^2$ is 0, the bias current Ibias can be a linear function of the power supply voltage Vdd.

$$\beta n3SB^2 = \beta p4S(1-K)^2 \quad \text{Eq. (7)}.$$

That is, the bias current Ibias can be expressed as a linear function of the power supply voltage Vdd under the condition shown in Equation 7. The condition shown in Equation 7 can be controlled using the characteristics of the transistors of the bias generator 50.

In the bias generator 50 of FIG. 3, the NMOS transistor N3 having the gate connected to the second bias node nd2 allows the bias current Ibias to decrease with a rise in the power supply voltage Vdd. Also, the second bias control unit 54 leads the bias current Ibias, which is varied with the power supply voltage Vdd as a quadratic function by the NMOS transistor N2, to vary with the power supply voltage Vdd as a linear function and generate a stable bias current Ibias. Also, the bias voltage Vbias is output in proportion to the bias current Ibias.

As a result, the bias generator 50 includes a bias generation unit having the bias mirror unit 51, the bias set unit 52, and the bias output unit 53. Thus, the bias generation unit generates the bias voltage Vbias through a bias output node "ndo" in proportion to the power supply voltage Vdd. However, the first bias control unit N3 primarily controls the bias voltage Vbias to be inversely proportional to the power supply voltage Vdd, and the second bias control unit 54 secondarily controls the bias voltage Vbias, which is inversely proportional to the power supply voltage Vdd, to vary with the power supply voltage Vdd as a linear function.

Figure 4:
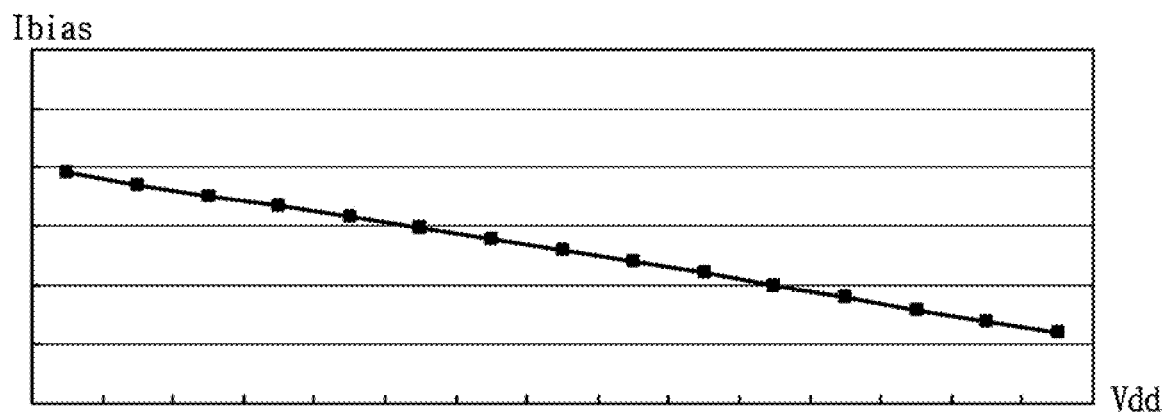
FIG. 4 is a graph showing the bias current characteristic of the bias generator of FIG. 3 as a function of power supply voltage.

FIG. 4 is a graph showing the bias current characteristics of the bias generator of FIG. 3 as a function of power supply voltage.

As shown in FIG. 4, the bias generator 50 leads the bias current Ibias to decrease with a rise in the power supply voltage Vdd. In this case, a slope of the bias current Ibias is controlled by regulating the characteristics of the transistors of the bias generator 50. Thus, when power noise occurs to raise the voltage level of the power supply voltage Vdd, the bias voltage Vbias drops, and when power noise occurs to drop the voltage level of the power supply voltage Vdd, the bias voltage Vbias rises. The power noise characteristics of the bias generator 50 is opposite to those of the regulator 40 such that a variation of the control voltage VC due to power noise can be inhibited, thereby reducing occurrence of jitter in the PLL. For example, a simulation was executed to apply imaginary power noise with a frequency of 1 MHz and an amplitude of 50 mV to a conventional PLL and a PLL according to an exemplary embodiment. As a result, jitter caused in the conventional PLL was 61 ps, while jitter caused in the PLL according to the exemplary embodiment was only 10 ps. That is, it can be seen that jitter was greatly reduced in the PLL according to the exemplary embodiment.

As a consequence, the bias generator 50 according to the exemplary embodiments described above is configured to have opposite power noise characteristics to those of the regulator 40. Thus, even if noise occurs in the power supply voltage Vdd, the occurrence of jitter in the output clock signal "oclk" of the PLL is minimized.

As described above, in the PLL according to the exemplary embodiments, the bias generator can have opposite power noise characteristics to those of the regulator, thereby minimizing the occurrence of jitter in the PLL due to power noise.

While exemplary embodiments have been disclosed herein, it should be understood that other variations may be possible. Such variations are not to be regarded as a departure from the spirit and scope of exemplary embodiments of the present application, and all such modifications as would be apparent to one skilled in the art are intended to be included within the scope of the following claims.

What is claimed is:

1. A phase-locked loop (PLL), comprising:
    a phase detector configured to compare the phase of an input clock signal with the phase of an output clock signal and output an up signal and a down signal;
    a charge pump configured to charge and discharge electric charges in response to the up signal and the down signal, respectively, and output a pumping voltage;
    a loop filter configured to filter the pumping voltage and output a filtering voltage;
    a bias generator configured to generate a bias voltage inversely proportional to a power supply voltage;
    a regulator configured to receive the bias voltage and the filtering voltage and output a control voltage having the same voltage level as the filtering voltage; and
    a voltage controlled oscillator configured to control and output the frequency of the output clock signal in response to the control voltage,
    wherein the bias generator comprises:
        a bias generation unit connected between the power supply voltage and a ground voltage and configured to generate a first bias set voltage and a second bias set voltage, which are proportional to the power supply voltage, through a first bias node and a second bias node, respectively, and to generate the bias voltage through a bias output node; and
        a first bias control unit connected between the bias output node and the ground voltage and configured to control the bias voltage to be inversely proportional to the power supply voltage in response to the second bias set voltage.

2. The PLL of claim 1, wherein the bias generator further comprises:
    a bias mirror unit connected between the power supply voltage and the first bias node and between the power supply voltage and the bias output node and configured to generate the bias voltage through the bias output node in response to the first bias set voltage;
    a bias set unit connected between the power supply voltage and the ground voltage and between the first bias node and the ground voltage and configured to control voltage levels of the first bias set voltage and the second bias set voltage in response to a voltage level of the power supply voltage; and
    a bias output unit connected between the bias output node and the ground voltage and configured to receive the bias voltage and output the bias voltage through the bias output node.

3. The PLL of claim 2, wherein the bias mirror unit comprises:
    a first p-type metal oxide semiconductor (PMOS) transistor connected between the power supply voltage and the first bias node and having a gate connected to the first bias node; and
    a second PMOS transistor connected between the power supply voltage and the bias output node and having a gate connected to the first bias node.

4. The PLL of claim 2, wherein the bias set unit comprises:
    a first n-type metal oxide semiconductor (NMOS) transistor connected between the first bias node and the second bias node;
    a resistor connected between the second bias node and the ground voltage; and
    an inverter configured to invert the second bias set voltage and apply the inverted second bias set voltage to a gate of the first NMOS transistor.

5. The PLL of claim 2, wherein the bias output unit comprises a third NMOS transistor connected between the bias output node and the ground voltage and having a gate connected to the bias output node.

6. The PLL of claim 1, wherein the first bias control unit comprises a second NMOS transistor connected between the bias output node and the ground voltage and having a gate to which the second bias set voltage is applied.

7. The PLL of claim 1,
    wherein the bias generator further comprises a second bias control unit connected between the power supply voltage and the bias output node and between the power supply voltage and the ground voltage and configured to control the bias voltage to be inversely proportional to the power supply voltage as a linear function in response to a voltage level of the power supply voltage, and
    wherein the second bias control unit comprises:
        a third PMOS transistor connected between the power supply voltage and the bias output node and having a gate connected to a third bias node;
        a fourth PMOS transistor connected between the power supply voltage and the third bias node and having a gate connected to the third bias node; and
        a fourth NMOS transistor connected between the third bias node and the ground voltage and having a gate connected to the third bias node.

8. A phase-locked loop (PLL), comprising:
    a phase detector configured to compare the phase of an input clock signal with the phase of an output clock signal and output an up signal and a down signal;
    a charge pump configured to charge and discharge electric charges in response to the up signal and the down signal, respectively, and output a pumping voltage;
    a loop filter configured to filter the pumping voltage and output a filtering voltage;
    a bias generator configured to generate a bias voltage inversely proportional to a power supply voltage;
    a regulator configured to receive the bias voltage and the filtering voltage and output a control voltage having the same voltage level as the filtering voltage; and a voltage controlled oscillator configured to control and output the frequency of the output clock signal in response to the control voltage, wherein the regulator comprises:

a differential input unit connected between a first node and a third node and between a second node and the third node and configured to detect a voltage difference between the filtering voltage and the control voltage and generate the voltage difference through the first and second nodes;

a first current mirror unit connected between the power supply voltage and the first node and between the power supply voltage and an output node through which the control voltage is output, and configured to mirror current supplied to the first node and control current supplied to the output node;

a second current mirror unit connected between the power supply voltage and the second node and between the power supply voltage and a fourth node and configured to mirror current supplied to the second node and control current supplied to the fourth node;

a third current mirror unit connected between the fourth node and the ground voltage and between the output node and the ground voltage and configured to mirror the current supplied to the fourth node and control current supplied to the output node; and a bias unit connected between the third node and the ground voltage and configured to receive the bias voltage and supply a bias current to the third node.

9. A bias generator, comprising:

a bias mirror unit connected between a power supply voltage and a first bias node and between the power supply voltage and a bias output node and configured to supply current corresponding to current supplied to the first bias node to the bias output node;

a bias set unit connected between the power supply voltage and a ground voltage and between the first bias node and the ground voltage and configured to control voltage levels of the first bias node and a second bias node connected between the first bias node and the ground node in response to a voltage level of the power supply voltage;

a first bias control unit connected between the bias output node and the ground voltage and configured to control a bias voltage to be inversely proportional to the power supply voltage in response to a voltage of the second bias node;

a bias output unit connected in parallel to the first bias control unit and configured to receive the bias voltage and output a bias output voltage through the bias output node; and a second bias control unit connected between the power supply voltage and the bias output node and between the power supply voltage and the ground voltage and configured to control the bias voltage to be inversely proportional to the power supply voltage as a linear function in response to the voltage level of the power supply voltage.

10. An apparatus for applying a control voltage to a voltage controlled oscillator comprising:

a bias generator configured to generate a bias voltage inversely proportional to a power supply voltage; and a regulator configured to receive the bias voltage and an input voltage and output a the control voltage having the same voltage level as the input voltage;

wherein the bias generator comprises:

a bias mirror unit connected between a power supply voltage and a first bias node and between the power supply voltage and a bias output node and configured to supply current corresponding to current supplied to the first bias node to the bias output node;

a bias set unit connected between the power supply voltage and a ground voltage and between the first bias node and the ground voltage and configured to control voltage levels of the first bias node and a second bias node connected between the first bias node and the ground node in response to a voltage level of the power supply voltage;

a first bias control unit connected between the bias output node and the ground voltage and configured to control a bias voltage to be inversely proportional to the power supply voltage in response to a voltage of the second bias node;

a bias output unit connected in parallel to the first bias control unit and configured to receive the bias voltage and output a bias output voltage through the bias output node; and a second bias control unit connected between the power supply voltage and the bias output node and between the power supply voltage and the ground voltage and configured to control the bias voltage to be inversely proportional to the power supply voltage as a linear function in response to the voltage level of the power supply voltage, and wherein the regulator comprises:

a differential input unit connected between a first regulator node and a third regulator node and between a second regulator node and the third regulator node and configured to detect a voltage difference between the input voltage and the control voltage and to generate the voltage difference through the first regulator node and the second regulator node;

a first current mirror unit connected between the power supply voltage and the first regulator node and between the power supply voltage and an output node through which the control voltage is output, and configured to mirror current supplied to the first regulator node and control current supplied to the output node;

a second current mirror unit connected between the power supply voltage and the second regulator node and between the power supply voltage and a fourth regulator node and configured to mirror current supplied to the second regulator node and control current supplied to the fourth regulator node;

a third current mirror unit connected between the fourth regulator node and the ground voltage and between the output node and the ground voltage and configured to mirror the current supplied to the fourth regulator node and control current supplied to the output node; and a regulator bias unit connected between the third regulator node and the ground voltage and configured to receive the bias output voltage and supply a bias current to the third regulator node.

* * * * *